(12) United States Patent
Blackburn et al.

(10) Patent No.: US 12,166,302 B2
(45) Date of Patent: Dec. 10, 2024

(54) ELECTRONIC ASSEMBLY FOR A COMMUNICATION SYSTEM

(71) Applicants: TE Connectivity Services GmbH, Schaffhausen (CH); Tyco Electronics (Shanghai) Co., Ltd., Shanghai (CN)

(72) Inventors: Christopher William Blackburn, Bothell, WA (US); Brian Patrick Costello, Scotts Valley, CA (US); Wei Zhao, Jiangsu (CN); Guoxiao Shen, Shanghai (CN)

(73) Assignee: TE CONNECTIVITY SOLUTIONS GmbH et al., Schaffhausen (CH)

( * ) Notice: Subject to any disclaimer, the term of this patent is extended or adjusted under 35 U.S.C. 154(b) by 368 days.

(21) Appl. No.: 17/676,274

(22) Filed: Feb. 21, 2022

(65) Prior Publication Data
US 2023/0261399 A1   Aug. 17, 2023

(51) Int. Cl.
*H01R 12/71* (2011.01)
*H01R 12/53* (2011.01)
*H01R 12/57* (2011.01)
*H01R 12/70* (2011.01)

(52) U.S. Cl.
CPC ......... *H01R 12/716* (2013.01); *H01R 12/53* (2013.01); *H01R 12/57* (2013.01); *H01R 12/7047* (2013.01)

(58) Field of Classification Search
None
See application file for complete search history.

(56) References Cited

U.S. PATENT DOCUMENTS 11,211,728 B2 * 12/2021 Do .......................... H01R 12/75
2020/0388548 A1 * 12/2020 Blackburn ........... G02B 6/4278

* cited by examiner

*Primary Examiner* — Ross N Gushi (57) ABSTRACT

An electronic assembly includes an interposer assembly and a cable connector module coupled to the interposer assembly. The interposer assembly includes an array of compressible interposer contacts each having upper and lower mating interfaces defining separable mating interfaces. The cable connector module includes a cable connector having a module substrate including module contacts at a bottom of the module substrate coupled to the upper mating interfaces of the corresponding interposer contacts. The cable connector module includes a backshell including a backshell cavity that receives the cable connector. The backshell includes a compression member engaging the cable connector and pressing the cable connector in the direction of the interposer assembly to compress the interposer contacts.

20 Claims, 8 Drawing Sheets

FIG. 14 ular Application No. 202210139669.3, filed 15 Feb. 2022, the subject matter
ELECTRONIC ASSEMBLY FOR A COMMUNICATION SYSTEM

CROSS REFERENCE TO RELATED APPLICATIONS

This application claims benefit to Chinese Application No. 202210139669.3, filed 15 Feb. 2022, the subject matter of which is herein incorporated by reference in its entirety.

BACKGROUND OF THE INVENTION

The subject matter herein relates generally to communication systems.

There is an ongoing trend toward smaller, lighter, and higher performance communication components and higher density systems, such as for ethernet switches or other system components. Typically, the system includes an electronic package coupled to a circuit board, such as through a socket connector. Electrical signals are routed between the electronic package and the circuit board. The electrical signals are then routed along traces on the circuit board to another component, such as a transceiver connector. The long electrical paths through the host circuit board reduce electrical performance of the system. Additionally, losses are experienced between the connector interfaces and along the electrical signal paths of the transceivers. Conventional systems are struggling with meeting signal and power output from the electronic package.

A need remains for a reliable communication system.

BRIEF DESCRIPTION OF THE INVENTION

In one embodiment, an electronic assembly is provided including an interposer assembly and a cable connector module coupled to the interposer assembly. The interposer assembly includes an array of interposer contacts that are compressible. Each interposer contact has an upper mating interface and a lower mating interface defining separable mating interfaces. The lower mating interfaces of the interposer contacts are configured to be electrically connected to board contacts of a circuit board. The cable connector module includes a cable connector having a module substrate including a contact array of module contacts at a bottom of the module substrate. The module contacts are coupled to the upper mating interfaces of the corresponding interposer contacts at a separable mating interface. The cable connector module includes a backshell including a backshell cavity. The cable connector is received in the backshell cavity. The backshell includes a compression member engaging the cable connector and pressing the cable connector in the direction of the interposer assembly to compress the interposer contacts.

In another embodiment, an electronic assembly is provided including an interposer assembly and a cable connector module coupled to the interposer assembly. The interposer assembly includes an array of interposer contacts that are compressible. Each interposer contact has an upper mating interface and a lower mating interface defining separable mating interfaces. The lower mating interfaces of the interposer contacts are configured to be electrically connected to board contacts of a circuit board. The cable connector module includes a cable connector having a module substrate including a contact array of module contacts at a bottom of the module substrate. The module contacts are coupled to the upper mating interfaces of the corresponding interposer contacts at a separable mating interface. The cable connector module includes a backshell including an upper wall and a sidewall extending from the upper wall. The sidewall defines a backshell cavity below the upper wall. The cable connector is received in the backshell cavity. The backshell includes a window through the upper wall receiving a heat transfer element in thermal communication with the cable connector in the backshell cavity to dissipate heat from the cable connector. The backshell includes a compression member coupled to an underside of the upper wall. The compression member at least partially surrounds the window on multiple sides of the window. The compression member engages the cable connector and pressing the cable connector in the direction of the interposer assembly to compress the interposer contacts.

In a further embodiment, a communication system is provided including a circuit board having an electronic package on the circuit board being electrically connected to the circuit board and mounting areas on an upper surface of the circuit board adjacent the electronic package including board contacts. The communication system incudes interposer assemblies coupled to the circuit board at the corresponding mounting areas and cable connector modules coupled to the corresponding interposer assemblies. Each interposer assembly includes an array of interposer contacts that are compressible. Each interposer contact has an upper mating interface and a lower mating interface defining separable mating interfaces. The lower mating interfaces of the interposer contacts are configured to be electrically connected to board contacts of a circuit board. Each cable connector module includes a cable connector having a module substrate including a contact array of module contacts at a bottom of the module substrate. The module contacts are coupled to the upper mating interfaces of the corresponding interposer contacts at a separable mating interface. The cable connector module includes a backshell including a backshell cavity. The cable connector is received in the backshell cavity. The backshell includes a compression member engaging the cable connector and pressing the cable connector in the direction of the interposer assembly to compress the interposer contacts.

DETAILED DESCRIPTION OF THE INVENTION

Figure 1:
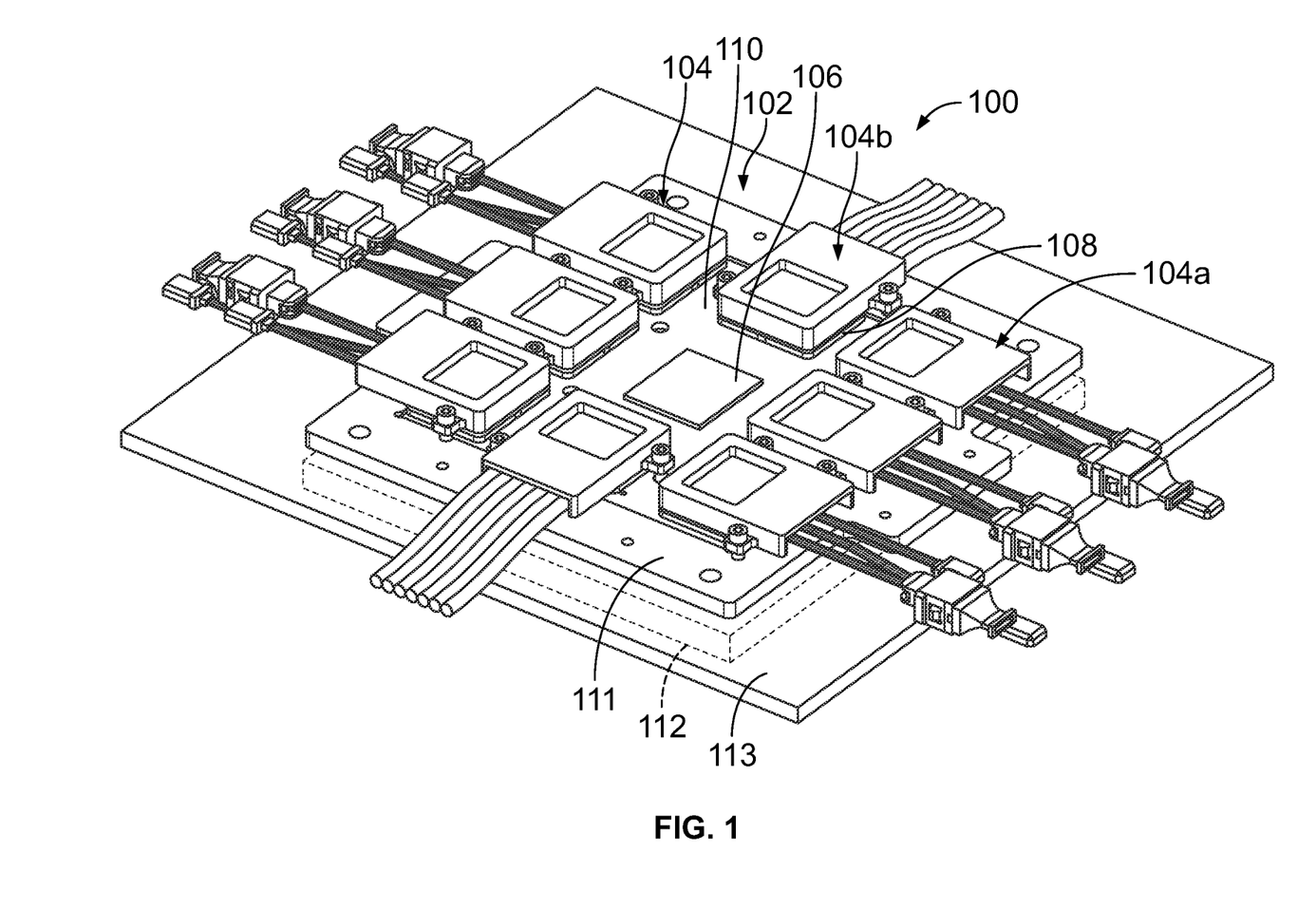
FIG. 1 is a top view of a communication system having an electronic assembly in accordance with an exemplary embodiment.

FIG. 1 is a top view of a communication system 100 having an electronic assembly 102 in accordance with an exemplary embodiment. The electronic assembly 102 includes one or more cable connector modules 104 electrically connected to a circuit board 110 by interposer assemblies 108. An electronic package 106 is electrically connected to the circuit board 110. The cable connector modules 104 are electrically connected to the electronic package 106 through the circuit board 110. A stiffener plate 111 may surround the circuit board 110 to provide support for the circuit board 110. In various embodiments, the cable connector modules 104 include optical modules 104a using fiber optic cables for data transmission and/or electrical modules 104b using electrical conductors to transmit electrical data signals.

In an exemplary embodiment, compression elements are used to load the cable connector modules 104 against the interposer assemblies 108 to electrically connect the cable connector modules 104 to the interposer assemblies 108 and to electrically connect the interposer assemblies 108 to the circuit board 110. For example, internal compression elements, such as springs, of the cable connector modules 104 may press components downward to load the interposer assemblies 108 and create mechanical and electrical connections between the cable connector modules 104 and the interposer assemblies 108. In an exemplary embodiment, the communication system 100 includes heat dissipating elements (not shown) to dissipate heat from the electronic package 106 and/or the cable connector modules 104.

In various embodiments, the electronic package 106 may be an integrated circuit assembly, such as an ASIC. However, the electronic package 106 may be another type of communication component. The electronic package 106 may be mounted to the circuit board 110. For example, the circuit board 110 may be a package substrate mounted to a host circuit board 113 separate from the package substrate. In other various embodiments, the system is provided without the host circuit board 113. Rather, the circuit board 110 may be a host circuit board and the electronic package may be mounted directly thereto. Optionally, the cable connector modules 104 may be provided on multiple sides of the circuit board 110. In the illustrated embodiment, the cable connector modules 104 are provided on multiple sides of the electronic package 106, such as on all four sides of the electronic package 106. Other arrangements are possible in alternative embodiments. In various embodiments, the cable connector modules 104 are individually clamped or compressed against the interposer assemblies 108 and are thus individually serviceable and removable from the circuit board 110.

Figure 2:
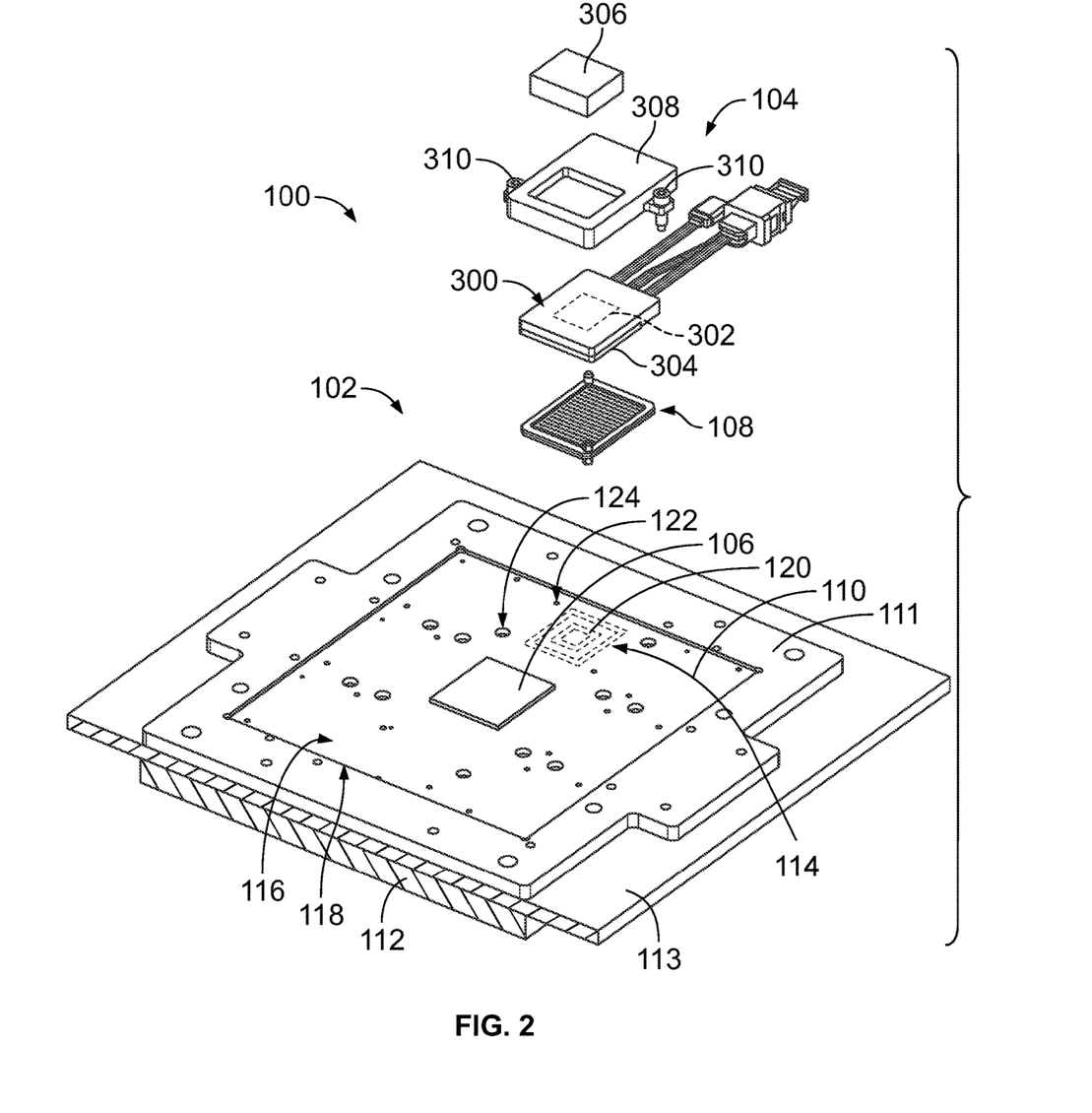
FIG. 2 is an exploded view of the communication system in accordance with an exemplary embodiment showing the electronic assembly and a circuit board of the communication system.

FIG. 2 is an exploded view of the communication system 100 in accordance with an exemplary embodiment showing the electronic assembly 102 and the circuit board 110. The electronic assembly 102 includes the cable connector module 104 and the interposer assembly 108. The interposer assembly 108 is used to electrically connect the cable connector module 104 to the circuit board 110. The electronic assembly 102 includes a bolster plate 112 used to secure the cable connector module 104 to the circuit board 110.

The circuit board 110 includes a mounting area 114 on an upper surface 116 of the circuit board 110. The mounting area 114 may be located adjacent the electronic package 106 (shown in FIG. 1). The circuit board 110 includes board contacts 120 at the mounting area 114. The board contacts 120 are arranged in an array, such as in rows and columns. The board contacts 120 may be pads or traces of the circuit board 110. The board contacts 120 may be high speed signal contacts, sideband signal contacts, ground contacts, or power contacts. In an exemplary embodiment, the circuit board 110 includes alignment openings 122 adjacent the mounting area 114. The interposer assembly 108 is coupled to the alignment openings 122 to orient the interposer assembly 108 relative to the circuit board 110. In an exemplary embodiment, the circuit board includes mounting openings 124 adjacent the mounting area 114. The cable connector module 104 and/or the bolster plate 112 are coupled to the circuit board 110 at the mounting openings 124.

The bolster plate 112 is located below a lower surface 118 of the circuit board 110. The bolster plate 112 may be mounted directly to the lower surface 118. In other various embodiments, the bolster plate 112 may be located below the host circuit board 113. The bolster plate 112 may strengthen or provide rigidity to the circuit board 110 and/or the host circuit board 113.

The cable connector module 104 includes a cable connector 300 having one or more components 302 on a module substrate 304. The cable connector module 104 may include a heat transfer element 306 thermally coupled to the cable connector 300, such as to dissipate heat from the components 302. The cable connector module 104 includes a backshell 308 that holds the other components together. The backshell 308 is configured to be coupled to the circuit board 110 and/or the stiffener plate 111 and/or the host circuit board 113 and/or the bolster plate 112 using mounting hardware 310. In an exemplary embodiment, the backshell 308 includes internal compression elements configured to engage and bias against the cable connector 300. The compression elements may press the cable connector 300 into interposer assembly 108.

Figure 3:
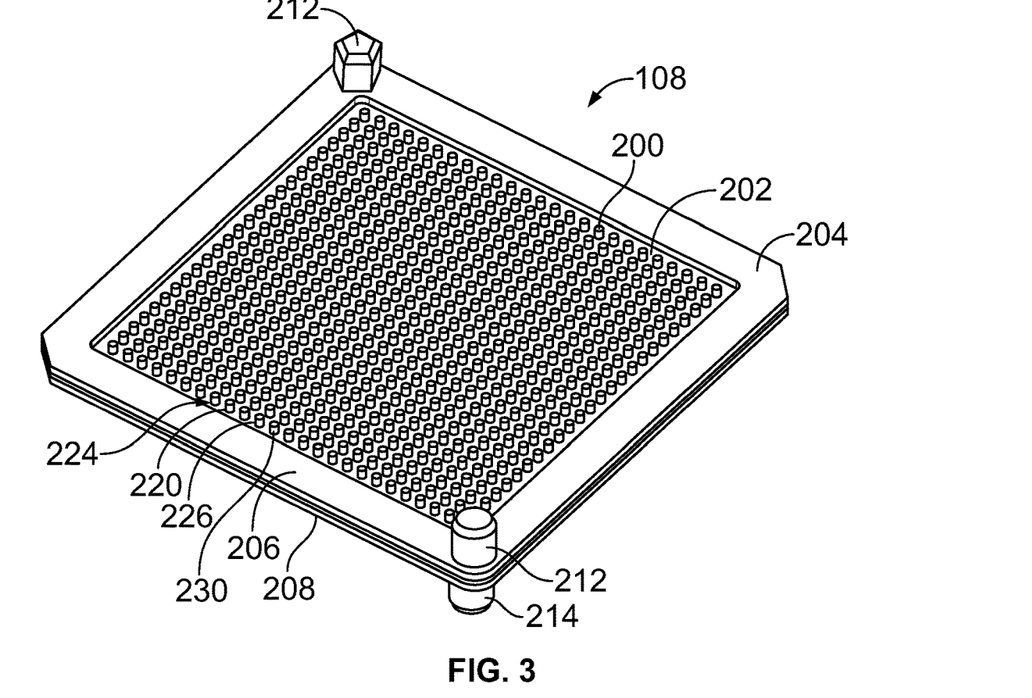
FIG. 3 is a top perspective view of an interposer assembly of the communication system in accordance with an exemplary embodiment.
Figure 4:
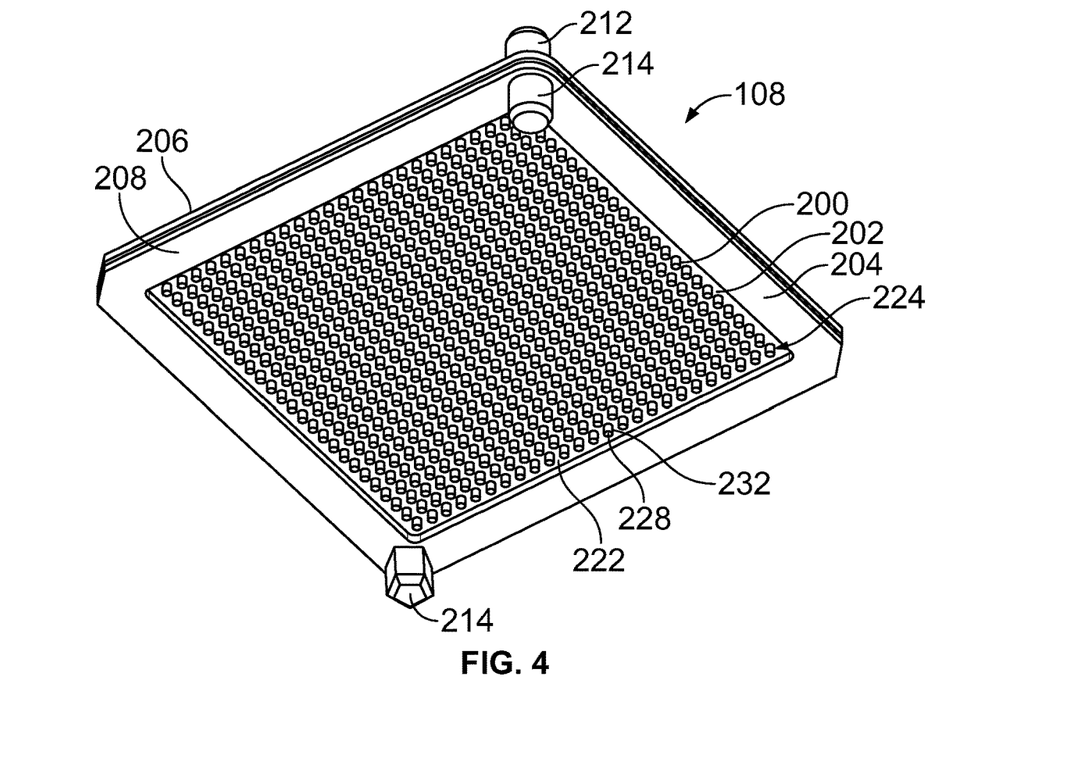
FIG. 4 is a bottom perspective view of the interposer assembly in accordance with an exemplary embodiment.

FIG. 3 is a top perspective view of the interposer assembly 108 in accordance with an exemplary embodiment. FIG. 4 is a bottom perspective view of the interposer assembly 108 in accordance with an exemplary embodiment. The interposer assembly 108 includes an array of interposer contacts 200 held together by a support plate 202. The interposer assembly 108 includes an interposer frame 204 holding the support plate 202 and the interposer contacts 200.

In an exemplary embodiment, the interposer frame 204 is a multipiece frame having an upper frame member 206 and a lower frame member 208. The support plate 202 is sandwiched between the upper frame member 206 and the lower frame member 208. In the illustrated embodiment, the interposer frame 204 extends around an outer periphery of the interposer assembly 108, such as along all four sides of the support plate 202. The interposer frame 204 may have other shapes in alternative embodiments.

In an exemplary embodiment, the interposer frame 204 includes upper locating pins 212 and lower locating pins 214. The upper locating pins 212 extend upward from the upper frame member 206. The upper locating pins 212 are used for locating the cable connector module 104 (shown in FIG. 2) relative to the interposer assembly 108. The upper locating pins 212 are received in alignment features, such as openings, of the cable connector module 104 to position the cable connector module 104 relative to the interposer frame 204 and the interposer contacts 200. The lower locating pins 214 extend downward from the lower frame member 208. The lower locating pins 214 are used for locating the interposer assembly 108 relative to the circuit board 110 (shown in FIG. 2). The lower locating pins 214 are received in the alignment openings 122 to position the interposer frame 204 and the interposer contacts 200 relative to the circuit board 110. Other types of locating features other than the locating pins 212, 214 may be used in alternative embodiments.

In an exemplary embodiment, the support plate 202 is a film having an upper surface 220 and a lower surface 222. The support plate 202 includes openings 224 therethrough holding corresponding interposer contacts 200. The support plate 202 is manufactured from an insulative material, such as a polyimide material, to electrically isolate the interposer contacts 200 from one another.

The interposer contacts 200 are held by the support plate 202. In an exemplary embodiment, the interposer contacts 200 are compressible contacts, such as conductive polymer columns. Each interposer contact 200 includes an upper mating interface 226 and a lower mating interface 228. The upper mating interface 226 is located above the upper surface 220 of the support plate 202 and the lower mating interface 228 is located below the lower surface 222 of the support plate 202. The interposer contacts 200 are compressible between the upper mating interfaces 226 and the lower mating interfaces 228. Optionally, the upper and lower mating interfaces 226, 228 may be planar interfaces oriented parallel to each other. Optionally, upper and lower sides 230, 232 of the interposer contacts 200 may be tapered. The upper and lower portions of the interposer contacts 200 may be cone-shaped, such as being frusto-conical. Other types of interposer contacts 200 may be utilized in alternative embodiments.

Figure 5:
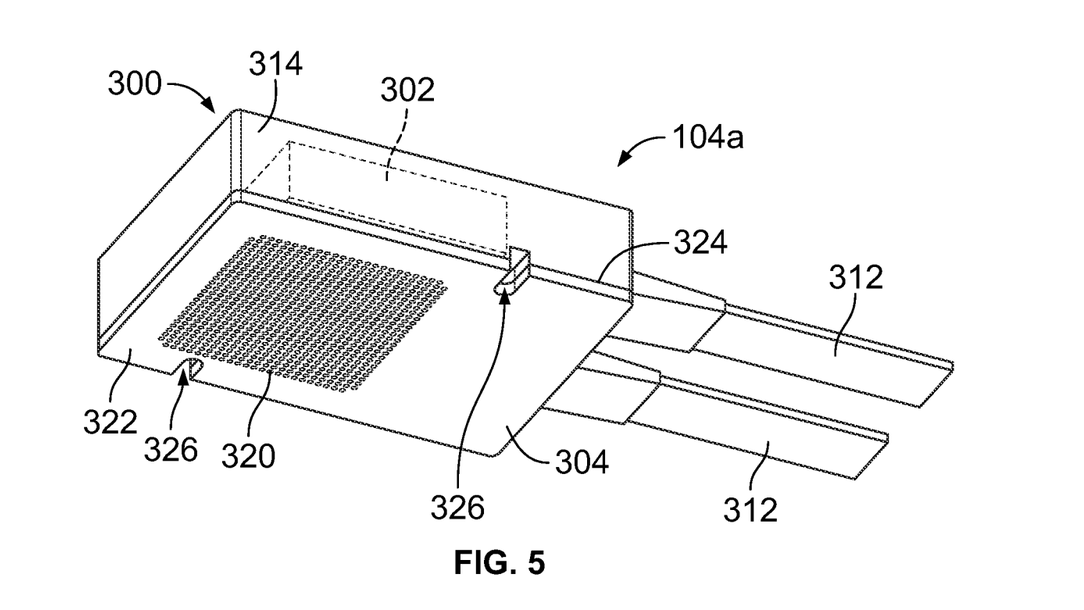
FIG. 5 is a bottom perspective view of a portion of a cable connector module of the electronic assembly in accordance with an exemplary embodiment.

FIG. 5 is a bottom perspective view of a portion of the cable connector module 104 in accordance with an exemplary embodiment. In the illustrated embodiment, the cable connector module 104 is the optical module 104a. FIG. 5 illustrates cables 312 extending from the cable connector 300. In the illustrated embodiment the cables 312 are fiber optic cables having optical fibers. The component 302 in the illustrated embodiment may be an optical engine. The optical fibers are optically coupled to the optical engine. The optical engine includes an optical-electrical converter for converting between optical signals and electrical signals. In various embodiments, the cable connector 300 may include a cover or housing 314 covering the components 302.

In an exemplary embodiment, the module substrate 304 includes a contact array of module contacts 320 at a bottom 322 of the module substrate 304. The components 302 (e.g., optical engine) is mounted to a top 324 of the module substrate 304. The module contacts 320 are coupled to the components 302. The module contacts 320 are configured to be coupled to the interposer contacts 200 (shown in FIG. 2). The module contacts 320 may define a separable mating interface with the interposer assembly 108. In an exemplary embodiment, the module substrate 304 includes alignment features 326 configured to align the module substrate 304 with the interposer assembly 108. For example, the alignment features 326 may be openings through the module substrate 304. The alignment features 326 receive the upper locating pins 212 (shown in FIG. 4) to orient the module substrate 304 with the interposer assembly 108.

Figure 6:
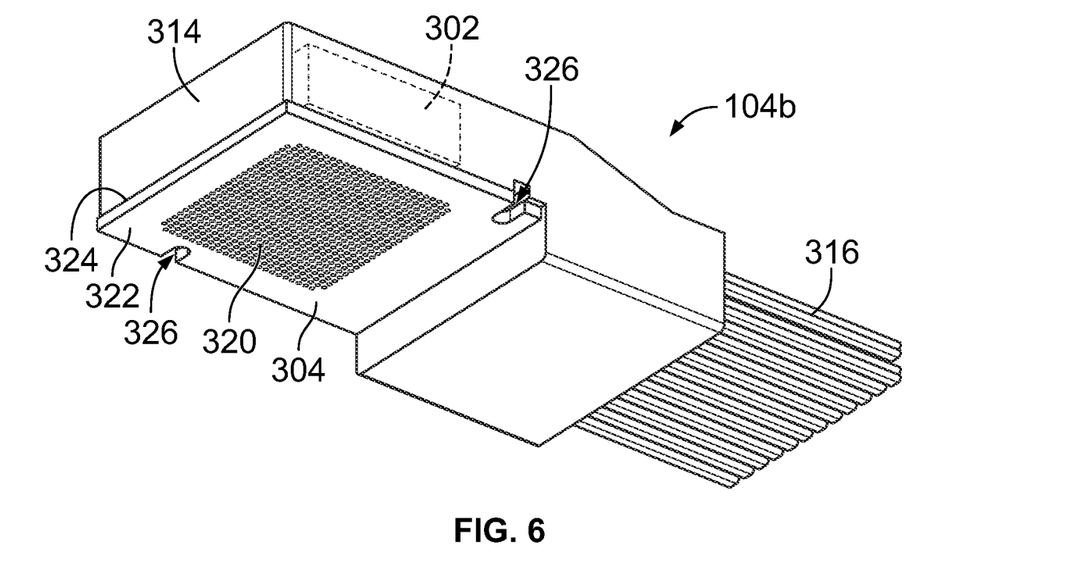
FIG. 6 is a bottom perspective view of a portion of the cable connector module in accordance with an exemplary embodiment.

FIG. 6 is a bottom perspective view of a portion of the cable connector module 104 in accordance with an exemplary embodiment. In the illustrated embodiment, the cable connector module 104 is the electrical module 104b. FIG. 6 illustrates cables 316 extending from the cable connector 300. The cables 316 may be terminated directly to the module substrate 304. In the illustrated embodiment, the cables 316 include copper conductors, such as coaxial cables, twin-axial cables, flat-flexible cables, or other types of electrical cables. The component 302 in the illustrated embodiment may be chips, processors, memories, or electrical components such as transistors, resistors, capacitors, and the like. In other embodiments, the cable connector 300 may be provided without any components 302. In various embodiments, the cable connector 300 may include the cover or housing 314 covering the components 302 and/or the cables 316.

The module substrate 304 includes the array of module contacts 320 at the bottom 322 of the module substrate 304. The cables 316 are terminated to the top 324 of the module substrate 304. The module contacts 320 are configured to be coupled to the interposer contacts 200 (shown in FIG. 2). The module contacts 320 may define a separable mating interface with the interposer assembly 108. In an exemplary embodiment, the module substrate 304 includes the alignment features 326 configured to align the module substrate 304 with the interposer assembly 108.

Figure 7:
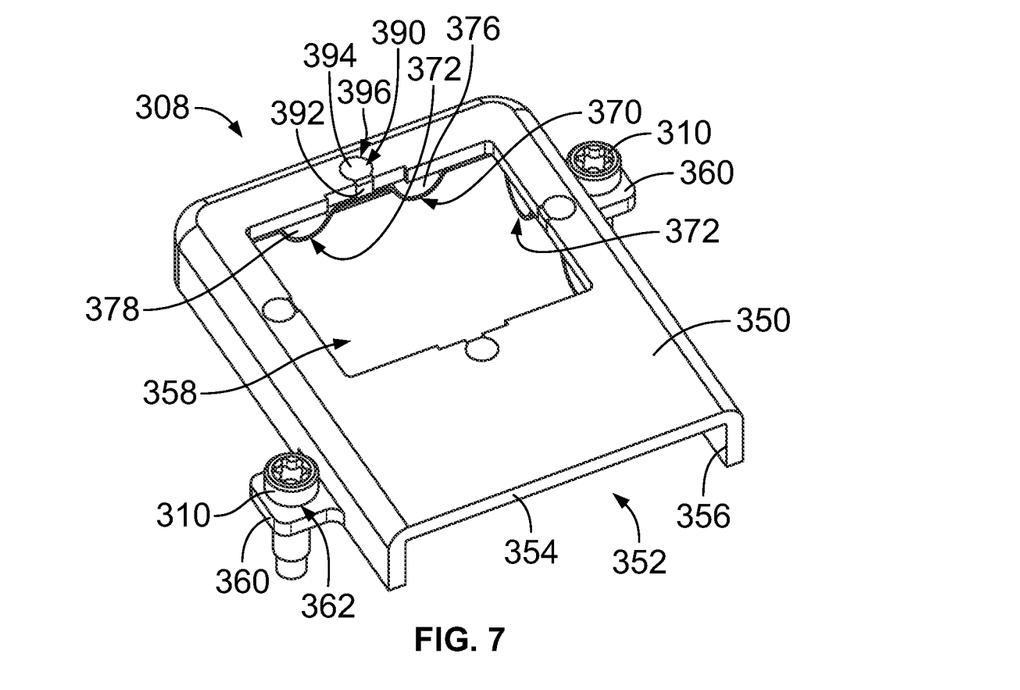
FIG. 7 is a top perspective view of a backshell of the cable connector module in accordance with an exemplary embodiment.
Figure 8:
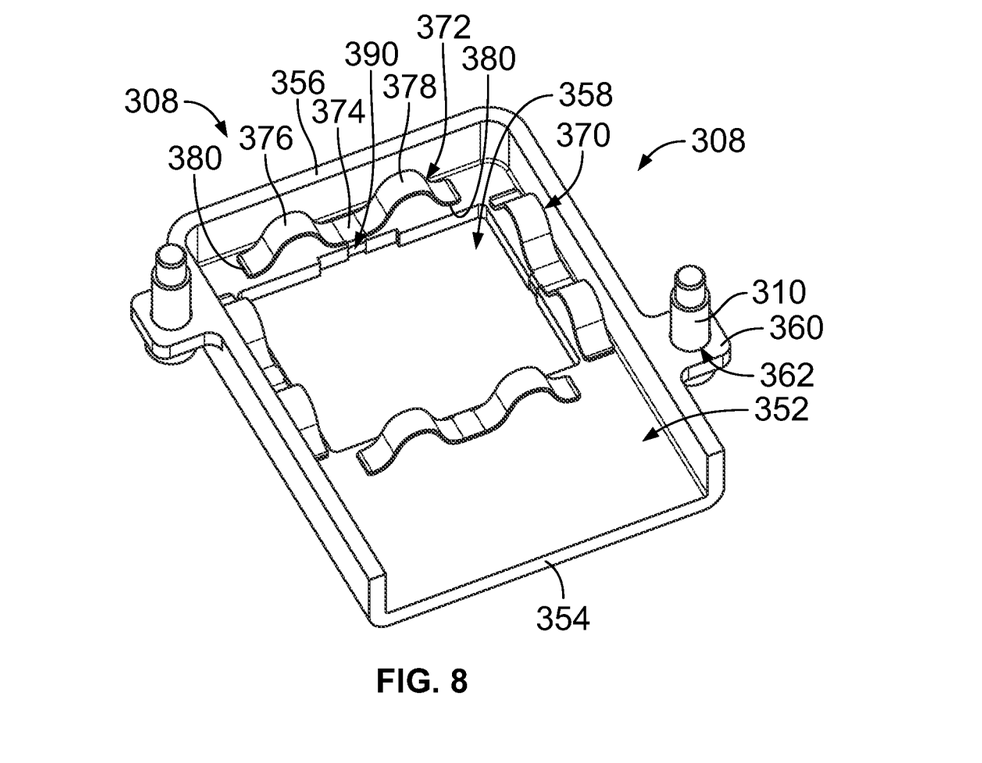
FIG. 8 is a bottom perspective view of the backshell in accordance with an exemplary embodiment.

FIG. 7 is a top perspective view of the backshell 308 in accordance with an exemplary embodiment. FIG. 8 is a bottom perspective view of the backshell 308 in accordance with an exemplary embodiment. The backshell 308 holds a compression member 370. The compression member 370 is configured to engage the cable connector 300 (FIG. 2) to press the cable connector 300 downward into the interposer assembly 108 (shown in FIG. 2). The compression member 370 presses the cable connector 300 in the direction of the interposer assembly 108 to compress the interposer contacts 200 to make a reliable mechanical and electrical connection between the cable connector 300 and the interposer assembly 108.

In an exemplary embodiment, the backshell 308 is manufactured from a metal material. Optionally, the backshell 308 may be diecast. The backshell 308 includes a main body 350 forming a backshell cavity 352. The main body 350 includes an upper wall 354 and a sidewall 356 extending from the bottom of the upper wall 354. The sidewall 356 forms the backshell cavity 352 below the upper wall 354. The backshell cavity 352 is configured to receive the cable connector 300 and may receive other components, such as the heat transfer element 306 (shown in FIG. 2).

The backshell 308 has a window 358 through the upper wall 354. The upper wall 354 surrounds the window 358. In the illustrated embodiment, the window 358 is rectangular having four perpendicular sides. The window 358 may have other shapes in alternative embodiments.

The backshell 308 includes mounting tabs 360 extending from the sidewall 356, such as from opposite sides of the backshell 308. The mounting tabs 360 have openings 362 that receive the mounting hardware 310. The mounting hardware 310 may be threaded fasteners. The mounting tabs 360 may be mounted to the circuit board 110 (shown in FIG. 2). In the illustrated embodiment, the mounting tabs 360 are staggered or offset relative to each other, such as forward and rearward, to spread the holding force from the mounting hardware 310.

Figure 9:
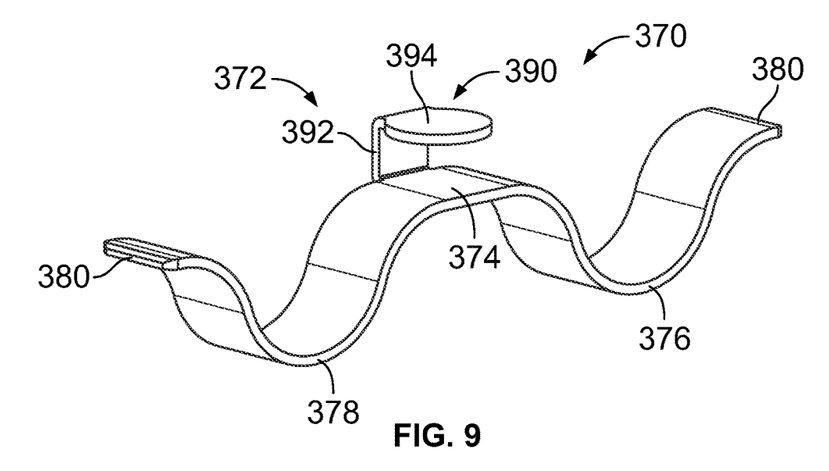
FIG. 9 is a perspective view of a compression member of the cable connector module in accordance with an exemplary embodiment.

FIG. 9 is a perspective view of the compression member 370 (or a portion of the compression member 370) in accordance with an exemplary embodiment. The compression member 370 includes a spring element 372. The compression member 370 may include multiple spring elements 372 in various embodiments.

The spring element 372 may be a metal spring element, such as a wave spring. The metal spring element may be stamped and formed. The spring element 372 includes a main body 374, a first spring arm 376 extending from a first side of the main body 374 and a second spring arm 378 extending from a second side of the main body 374. The spring arms 376, 378 are wave shaped in the illustrated embodiment; however, the spring arms 376, 378 may have other shapes in alternative embodiments. The spring arms 376, 378 extend to distal ends 380 opposite the main body 374.

The spring element 372 includes a mounting tab 390 extending from the main body 374. The mounting tab 390 has an extension arm 392 and a pad 394 extending from the extension arm 392. The pad 394 may be oriented parallel to and spaced apart from the main body 374.

With reference back to FIGS. 7 and 8, the spring elements 372 are coupled to the backshell 308. The mounting tabs 390 are coupled to the upper wall 354. For example, the mounting tabs 390 may extend through the window 358 and are clipped onto the upper wall 354. The extension arms 392 extend along the interior edges of the window 358 of the upper wall 354 and the pads 394 extend along the upper surface of the upper wall 354. The pads 394 may be received in pockets 396 formed in the upper surface of the upper wall 354.

In the illustrated embodiment, four of the spring elements 372 are provided to form the compression member 370. The spring elements 372 are provided on the four sides of the window 358 surrounding the perimeter of the window 358. The main body 374 and the spring arms 376, 378 are located in the backshell cavity 352 and engage the upper wall 354. In an exemplary embodiment, each spring element 372 includes multiple points of contact with the upper wall 354, such as at the main body 374 and the distal ends 380 of the spring arms 376, 378. The spring arms 376, 378 extend away from the upper wall 354 and are configured to interface with the cable connector 300. The spring arms 376, 378 may be deflected and compressed when mated to the cable connector 300. The distal ends 380 may move along the upper wall 354, such as in a sliding movement.

Figure 10:
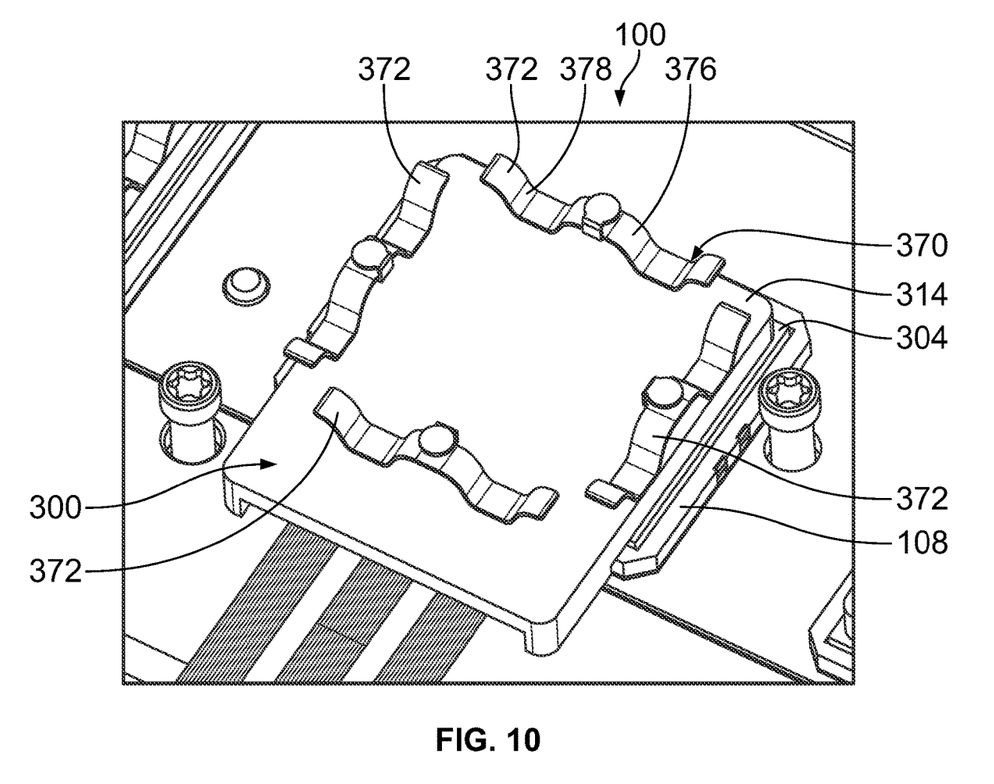
FIG. 10 is a top perspective view of a portion of the communication system showing the cable connector coupled to the interposer assembly.

FIG. 10 is a top perspective view of a portion of the communication system 100 showing the cable connector 300 coupled to the interposer assembly 108. The backshell 308 (shown in FIGS. 7 and 8) is removed for clarity to illustrate the compression member 370 and the cable connector 300. The module substrate 304 of the cable connector 300 is mated with the interposer assembly 108. The housing 314 of the cable connector 300 is located above the module substrate 304. The compression member 370 engages the housing 314 of the cable connector 300 to press the cable connector 300 in the direction of the interposer assembly 108 to compress the interposer contacts 200 (shown in FIGS. 3 and 4).

When assembled, the compression member 370 is located above the cable connector 300. The housing 314 and the module substrate 304 are stacked between the compression member 370 and the interposer assembly 108. The compression member 370 is configured to press downward against the cable connector 300 to compress the interposer assembly 108. In an exemplary embodiment, the spring elements 372 of the compression member 370 form a rectangular compression box around the perimeter of the cable connector 300. The spring arms 376, 378 of the spring members 372 engage the top of the cable connector 300 and press downward against the cable connector 300. Optionally, each spring member 372 includes multiple points of contact with the cable connector 300, such as defined by each of the spring arms 376, 378. The points of contact may be located near outer edges of the housing 314 of the cable connector 300. All four sides of the cable connector 300 are pressed downward toward the interposer assembly 108. The spring members 372 may generally extend along the outer edges or perimeter of the interposer assembly 108, such as around the outer perimeter of the array of interposer contacts 200.

Figure 11:
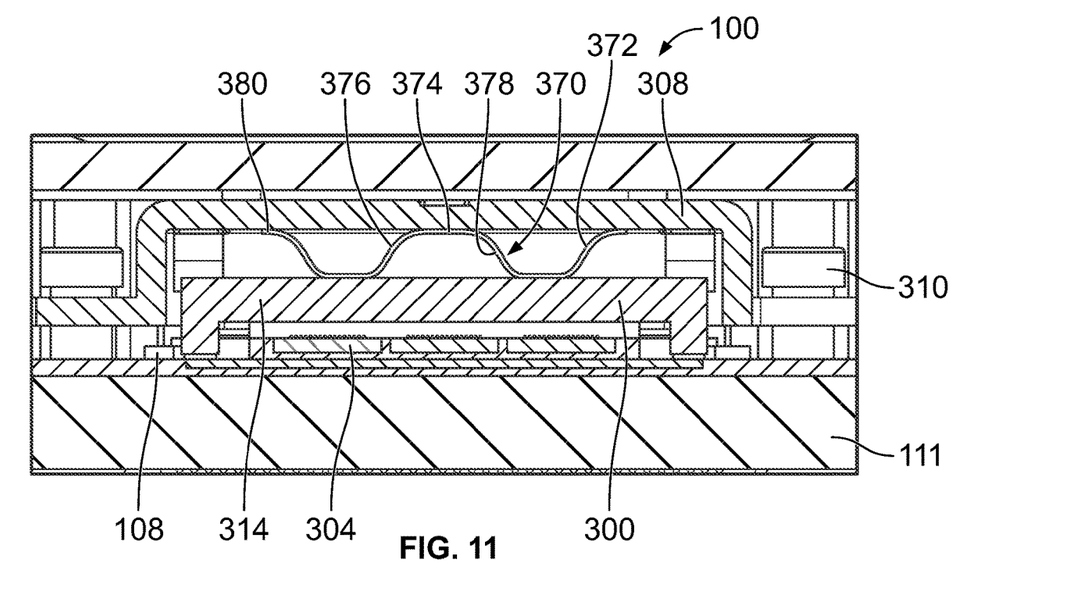
FIG. 11 is a cross-sectional view of a portion of the communication system showing the cable connector coupled to the interposer assembly.
Figure 12:
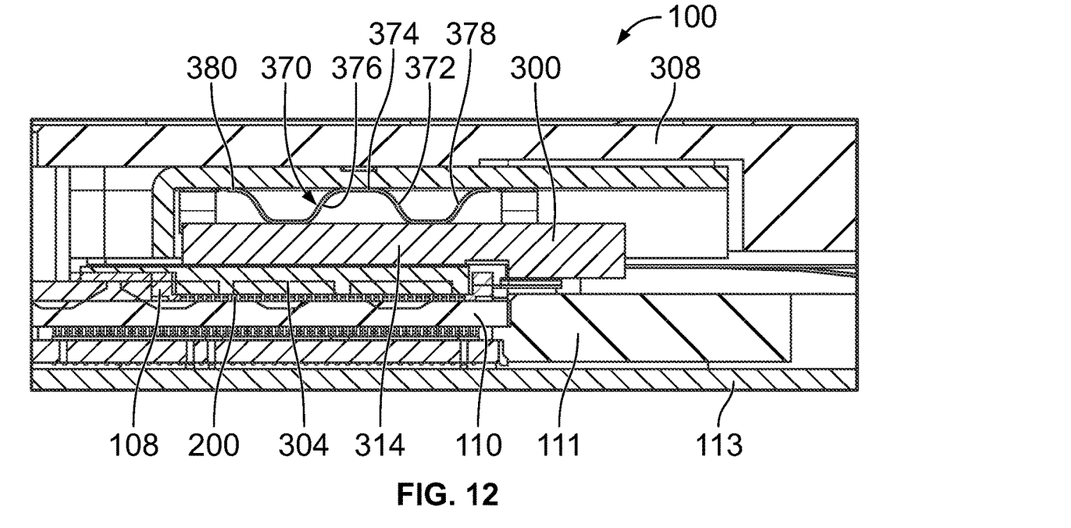
FIG. 12 is a cross-sectional view of a portion of the communication system showing the cable connector coupled to the interposer assembly.

FIG. 11 is a cross-sectional view of a portion of the communication system 100 showing the cable connector 300 coupled to the interposer assembly 108. FIG. 12 is a cross-sectional view of a portion of the communication system 100 showing the cable connector 300 coupled to the interposer assembly 108. FIG. 11 is an end view and FIG. 12 is a side view. FIGS. 11 and 12 illustrate the stiffener plate 111, which holds the circuit board 110 (FIG. 12) above the host circuit board 113 (FIG. 12).

The module substrate 304 of the cable connector 300 is mated with the interposer assembly 108. The housing 314 of the cable connector 300 is located above the module substrate 304. The compression member 370 engages the housing 314 of the cable connector 300 to press the cable connector 300 in the direction of the interposer assembly 108 to compress the interposer contacts 200. The spring arms 376, 378 of the spring members 372 engage the top of the cable connector 300 and press downward against the cable connector 300. Each spring arm 376, 378 forms a point of contact with the cable connector 300. The main body 374 and the distal ends 380 of the spring arms 376, 378 define points of contact with the backshell 308. When assembled, the backshell 308 is coupled to the bolster plate 112 by the mounting hardware 310. The backshell 308 presses against the spring members 372. The spring members 372 are compressed between the backshell 308 and the cable connector 300. The compression of the spring arms 376, 378 is transferred to the cable connector 300 to press downward against the interposer assembly 108 and compress the interposer contacts 200.

Figure 13:
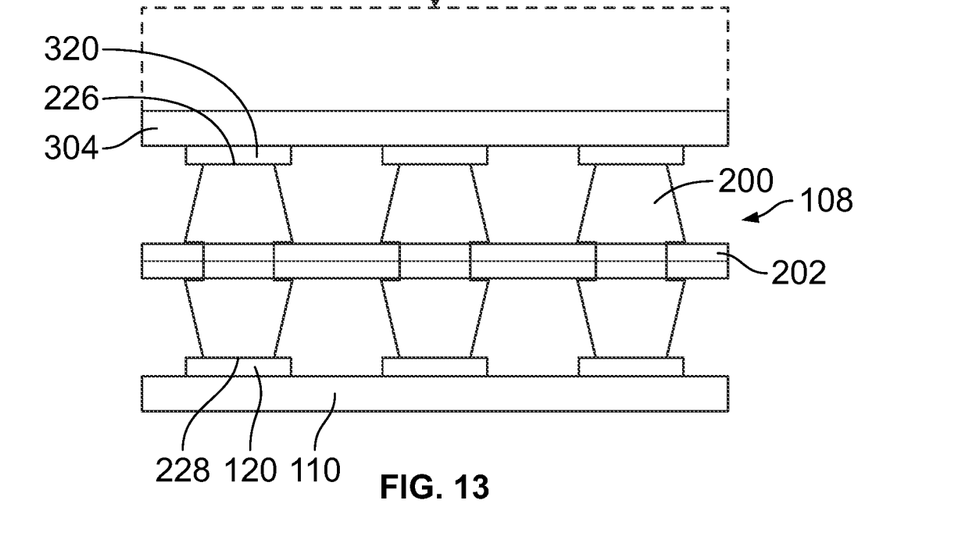
FIG. 13 is a side view of a portion of the interposer assembly in accordance with an exemplary embodiment.

FIG. 13 is a side view of a portion of the interposer assembly 108 showing the support plate 202 and a plurality of the interposer contacts 200 located between the circuit board 110 and the module substrate 304. The interposer contacts 200 are held by the support plate 202. In an exemplary embodiment, the interposer contacts 200 are compressible contacts, such as conductive polymer columns. The upper mating interfaces 226 interface with the module contacts 320 at the bottom of the module substrate 304. The lower mating interfaces 228 interface with the board contact 120 of the circuit board 110. The interposer contacts 200 are compressible between the upper mating interfaces 226 and the lower mating interfaces 228. In an exemplary embodiment, pressure or force from above the interposer assembly 108, such as from the module substrate 304 is used to compress the interposer contacts 200. For example, the compression member 370 provides the compression force to compress the interposer contacts 200.

Figure 14:
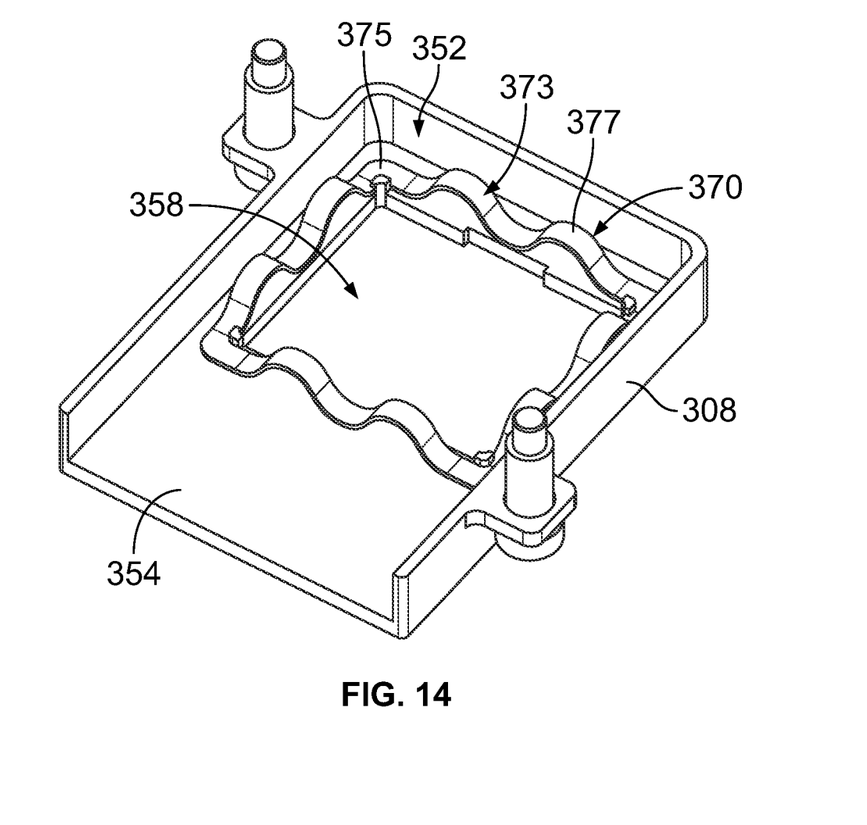
FIG. 14 is a bottom perspective view of the backshell in accordance with an exemplary embodiment.

FIG. 14 is a bottom perspective view of the backshell 308 in accordance with an exemplary embodiment. The compression member 370 is located in the backshell cavity 352. In the illustrated embodiment, the compression member 370 is a single piece rather than having a plurality of individual spring elements 372 (shown in FIG. 4). The compression member 370 includes a spring element 373 having a plurality of bases 375 and spring arms 377 between the bases 375. The spring element 373 is rectangular shaped surrounding the perimeter of the window 358. The bases 375 are located in the corners. In the illustrated embodiment, the spring arms 377 are wave shaped undulating toward and away from the upper wall 354. The spring arms 377 are compressible and configured to engage the cable connector 300 (shown in FIG. 2).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic assembly comprising:
an interposer assembly including an array of interposer contacts, the interposer contacts being compressible, each interposer contact having an upper mating interface and a lower mating interface, the upper mating interfaces defining separable mating interfaces, the lower mating interfaces of the interposer contacts configured to be electrically connected to board contacts of a circuit board; and
a cable connector module coupled to the interposer assembly, the cable connector module including a cable connector having a module substrate including a contact array of module contacts at a bottom of the module substrate, the module contacts being coupled to the upper mating interfaces of the corresponding interposer contacts at a separable mating interface, the cable connector module including a backshell including a backshell cavity, the cable connector received in the backshell cavity, the backshell including a compression member engaging the cable connector and pressing the cable connector in the direction of the interposer assembly to compress the interposer contacts, wherein the compression member is located in the backshell cavity.

2. The electronic assembly of claim 1, wherein the compression member is supported independent of the interposer assembly and the circuit board by the backshell cavity.

3. The electronic assembly of claim 1, wherein the compression member extends along at least two different sides of the array of interposer contacts.

4. The electronic assembly of claim 1, wherein the compression member includes a first spring element and a second spring element spaced apart from the first spring element.

5. The electronic assembly of claim 1, wherein the compression member includes a plurality of spring elements forming a rectangular compression box pressing against a perimeter of the cable connector.

6. The electronic assembly of claim 1, wherein the compression member is a wave spring having multiple points of contact with the backshell and having multiple points of contact with the cable connector.

7. The electronic assembly of claim 1, wherein the compression member includes a mounting tab coupled to the backshell.

8. The electronic assembly of claim 1, wherein the cable connector module includes a bolster plate located below the interposer assembly, the backshell including mounting hardware coupled to the bolster plate to secure the backshell relative to the circuit board, the compression member being located between the backshell and the bolster plate to compress the interposer contacts.

9. The electronic assembly of claim 1, wherein the backshell includes an upper wall and a sidewall extending from the upper wall, the sidewall defining the backshell cavity below the upper wall, the backshell including a window through the upper wall, the compression member extending along the window.

10. The electronic assembly of claim 9, wherein the compression member surrounds a perimeter of the window.

11. The electronic assembly of claim 9, wherein the cable connector module includes a heat transfer element received in the window in thermal communication with the cable connector in the backshell cavity to dissipate heat from the cable connector.

12. The electronic assembly of claim 1, wherein the cable connector is a fiber optic connector having an optical engine mounted to the module substrate, the fiber optic connector holding at least one optical fiber optically coupled to the optical engine, the module contacts being electrically connected to the optical engine.

13. The electronic assembly of claim 1, wherein the cable connector includes a plurality of cables having conductors electrically connected to the module substrate.

14. An electronic assembly comprising:
an interposer assembly including an array of interposer contacts, the interposer contacts being compressible, each interposer contact having an upper mating interface and a lower mating interface, the upper mating interfaces defining separable mating interfaces, the lower mating interfaces of the interposer contacts configured to be electrically connected to board contacts of a circuit board; and
a cable connector module coupled to the interposer assembly, the cable connector module including a cable connector having a module substrate including a contact array of module contacts at a bottom of the module substrate, the module contacts being coupled to the upper mating interfaces of the corresponding interposer contacts at a separable mating interface, the cable connector module including a backshell including an upper wall and a sidewall extending from the upper wall, the sidewall defining a backshell cavity below the upper wall, the cable connector received in the backshell cavity, the backshell including a window through the upper wall receiving a heat transfer element in thermal communication with the cable connector in the backshell cavity to dissipate heat from the cable connector, the backshell including a compression member coupled to an underside of the upper wall, the compression member at least partially surrounding the window on multiple sides of the window, the compression member engaging the cable connector and pressing the cable connector in the direction of the interposer assembly to compress the interposer contacts.

15. The electronic assembly of claim 14, wherein the compression member extends along at least two different sides of the cable connector.

16. The electronic assembly of claim 14, wherein the compression member includes a first spring element and a second spring element spaced apart from the first spring element, the first and second spring elements extending along different sides of the window.

17. The electronic assembly of claim 14, wherein the compression member includes a plurality of spring elements extending along four different sides of the window forming a rectangular compression box pressing against the cable connector.

18. The electronic assembly of claim 14, wherein the compression member is a wave spring having multiple points of contact with the backshell and having multiple points of contact with the cable connector.

19. The electronic assembly of claim 14, wherein the cable connector module includes a bolster plate located below the interposer assembly, the backshell including mounting hardware coupled to the bolster plate to secure the backshell relative to the circuit board, the compression member being located between the backshell and the bolster plate to compress the interposer contacts.

20. A communication system comprising:

a circuit board having an electronic package on the circuit board, the electronic package being electrically connected to the circuit board, the circuit board having mounting areas on an upper surface of the circuit board adjacent the electronic package, each mounting area including board contacts;

interposer assemblies coupled to the circuit board at the corresponding mounting areas, each interposer assembly including an interposer assembly including an array of interposer contacts, the interposer contacts being compressible, each interposer contact having an upper mating interface and a lower mating interface, the upper mating interfaces defining separable mating interfaces, the lower mating interfaces of the interposer contacts configured to be electrically connected to the corresponding board contacts of the circuit board; and cable connector modules coupled to the corresponding interposer assemblies, each cable connector module including a cable connector having a module substrate including a contact array of module contacts at a bottom of the module substrate, the module contacts being coupled to the upper mating interfaces of the corresponding interposer contacts at a separable mating interface, the cable connector module including a backshell including a backshell cavity, the cable connector received in the backshell cavity, the backshell including a compression member engaging the cable connector and pressing the cable connector in the direction of the corresponding interposer assembly to compress the interposer contacts, wherein the compression member is located in the backshell cavity.

* * * * *